(12) United States Patent
Hsu et al.

(10) Patent No.: US 6,706,602 B2
(45) Date of Patent: Mar. 16, 2004

(54) MANUFACTURING METHOD OF FLASH MEMORY

(75) Inventors: Cheng-Yuan Hsu, Hsinchu (TW); Chi-Shan Wu, Shindian (TW); Chih-Ming Chen, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 46 days.

(21) Appl. No.: 10/064,667

(22) Filed: Aug. 5, 2002

(65) Prior Publication Data

US 2004/0023458 A1 Feb. 5, 2004

(51) Int. Cl.[7] ............................................. H01L 21/336
(52) U.S. Cl. .................... 438/267; 257/315; 438/257
(58) Field of Search .................... 438/211, 257, 438/267

(56) References Cited

U.S. PATENT DOCUMENTS

| | | | | |
|---|---|---|---|---|
| 5,455,792 A | * | 10/1995 | Yi | 365/185.12 |
| 6,096,603 A | * | 8/2000 | Chang et al. | 438/258 |
| 6,531,734 B1 | * | 3/2003 | Wu | 257/315 |
| 6,552,386 B1 | * | 4/2003 | Wu | 257/315 |
| 6,563,166 B1 | * | 5/2003 | Ni | 257/316 |

* cited by examiner

Primary Examiner—Hoai Ho
(74) Attorney, Agent, or Firm—Liang Chyun IP Office

(57) ABSTRACT

A manufacturing method of flash memory. A substrate is provided, on which a gate structure is formed. A first spacer is formed on the sidewalls of the gate structure. A source region is formed in the substrate at one side of the gate structure. A first conductive layer and a sacrificial layer are formed on the substrate. The first conductive layer and the sacrificial layer are removed until the gate structure is exposed. A thermal oxidation process is performed to form a mask layer on the first conductive layer and the gate structure. The sacrificial layer remaining on the first conductive layer is removed, and the first conductive layer is etched with a square shape. The mask layer is removed, and a second spacer is formed on the sidewalls of the second conductive layer. A drain region is formed in the substrate at one side of the conductive layer.

20 Claims, 4 Drawing Sheets

MANUFACTURING METHOD OF FLASH MEMORY

BACKGROUND OF INVENTION

1. Field of the Invention

The invention relates in general to a manufacturing method of a flash memory, and more particular, to a manufacturing method of a flash memory with a square word line spacer.

2. Related Art of the Invention

The memory is literalized as a semiconductor device used to store information or data. As the functions of computer microprocessors become more and more powerful, and software programs become more and more massive, memory demand is becoming consequently higher and higher. To comply with the trends for fabricating memory with larger capacity and cheaper cost, the technique and process for memory fabrication is driven by the challenge of higher integration.

For example, the flash memory device allows the performance of multiple saving, reading and erasing operations. Plus the advantage that the data saved therein is retained even when the power is switched off, flash memory has become a nonvolatile memory device broadly applied in personal computer and electronic equipment.

The typical flash memory uses doped polysilicon for forming the floating gate and the control gate. The floating gate and the control gate are isolated from each other by a dielectric layer, while a tunnel oxide layer is formed between the floating gate and the substrate. While performing data write/erase operations, a bias is applied across the control gate and the source/drain region, so that electrons are injected into or pulled from the floating gate. While reading the data saved in the flash memory, a working voltage is applied to the control gate, such that the conducting status of the floating gate affects the on/off status of the underlying channel, the reference to determine the data value of "0" or "1".

When performing data erase on flash memory, the relative voltage of the substrate, the drain (source) region or the control gate is raised. The electrons then tunnel through the tunneling oxide from the floating gate to the substrate or the drain (source) region, which is referred as the substrate erase or the drain (source) erase. Alternatively, the electrons tunnel through the dielectric layer to the control gate. However, in the erase operation of the data saved in the flash memory, the amount of electrons tunneling from the floating gate is difficult to control, often resulting in a positive charged floating gate by ejecting excessive amount of electrons. Such an effect is referred to as over-erase. When the over-erase becomes significant, the channel underneath the floating gate is continuously conducted even when the working voltage is not applied to the control gate to cause data error. To resolve the over-erase problem, the industry has developed tri-layered sub-gate high-density flash memory.

Referring to FIG. 1, a tunneling oxide layer 102, a floating gate 104 and a control gate 106 made of doped polysilicon are formed on a substrate 100. The floating gate 104 is formed underneath the control gate 106. After formation of the floating and control gates 104 and 106, dopant is implanted into the substrate 100 to form a source region 108. After forming the source region 108, a spacer 110 is formed on the sidewall of the floating and control gates 104 and 106. A polysilicon layer (not shown) is formed on the substrate 100, and an anisotropic etching process is performed to etch the polysilicon layer, such that a select gate 112 is formed on the sidewall of the spacer 110. The select gate 112 is used as the word line of the flash memory. A lightly doped region (LDD) 114 is then formed at one side of the select gate 112. A spacer 116 is formed on the select gate 112, and a drain region 118 is further formed in the substrate 100.

In the above fabrication process of the flash memory, as the select gate 112 is not formed in a square shape, the shape of the spacer 116 formed subsequently adversely affects the formation of the lightly doped region 114. Further, as the integration of the semiconductors increases, cobalt silicide is frequently formed on the select gate 112. If the shape of the spacer 116 is not optimized, contact between the contact window and cobalt silicide formed subsequently may seriously deteriorate the quality of devices and reduce the product yield. Therefore, to have the spacer of the gate structure formed with a square shape is crucial.

SUMMARY OF THE INVENTION

The present invention provides a manufacturing method of a flash memory allowing a select gate formed on the spacer of the stacked gate structure having a square shape, such that device performance is improved, and the product yield is enhanced.

The present invention further provides a simplified manufacturing method, by which a square-shaped spacer is formed on the sidewall of a stacked gate structure.

In the manufacturing method provided by the present invention, a substrate on which a gate structure is formed is provided. A source region is formed in the substrate at one side of the gate structure. A spacer is formed on the sidewall of the gate structure. A first conductive layer and a sacrificial layer are formed on the substrate, of which portions are removed using chemical mechanical polishing until the gate structure is exposed. A thermal oxidation process is performed to form a mask layer on the first conductive layer and the gate structure. The remaining sacrificial layer remaining on the first conductive layer is removed using the mask layer as a mask. The first conductive layer is etched into a square second conductive layer. The mask layer is removed. A lightly doped region is formed in the substrate at one side of the second conductive layer. A drain region is then formed in the substrate at the same side of the second conductive layer.

In the present invention, a conductive layer and a sacrificial layer are formed after formation of the gate structure, the source region and the spacer. Chemical mechanical polishing is applied to remove portions of the conductive layer and the sacrificial layer until the gate cap layer is exposed. The mask layer is then formed using thermal oxidation, and a wet etching step is performed to remove the sacrificial layer. The mask layer is then used as a mask to form the square select gate.

The present invention uses the mask layer as the etching mask directly, so that a photolithography process is not performed, allowing for a wider process window:The fabrication time and cost are thus reduced. Further, by the simplified process, a square select gate is formed to result in a good isolation effect for the spacer formed subsequently. The electrical contact between the contact window and the metal silicide can thus be avoided, while the device performance and product yield can be enhanced.

The present invention further provides a manufacturing method of a square spacer. A spacer on which a stacked structure is formed is provided. A conductive layer and a sacrificial layer are formed on the substrate. Portions of the conductive layer and the sacrificial layer are removed until the stacked structure is exposed. A mask layer is formed on the conductive layer and the stacked structure. The sacrificial layer on the conductive layer is then removed. Using the mask layer as a mask, the conductive layer is etched to form a square spacer.

After formation of the stacked structure, the conductive layer and the sacrificial layer are formed on the substrate. Chemical mechanical polishing is then performed to remove portions of the sacrificial layer and the conductive layer until the stacked structure is exposed. The thermal oxidation process is then performed to form the mask layer on the stacked structure and the conductive layer. A wet etching step is performed to remove the sacrificial layer. The mask layer is then used as a mask to etch the conductive layer, so as to form a square spacer.

The present invention uses the mask layer as the etching mask directly without performing photolithography, so that a spacer with a square shape can be easily formed with reduced cost and process time.

BRIEF DESCRIPTION OF DRAWINGS

These, as well as other features of the present invention, will become more apparent upon reference to the drawings wherein.

DETAILED DESCRIPTION

Figure 1:
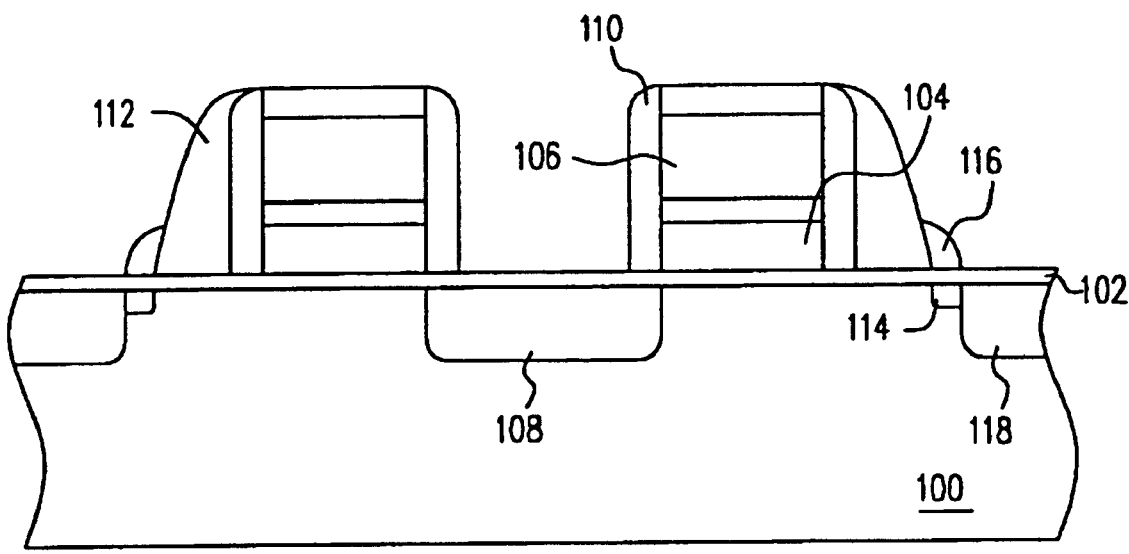
FIG. 1 is a cross section showing the conventional flash memory with a split gate.
Figure 2A:
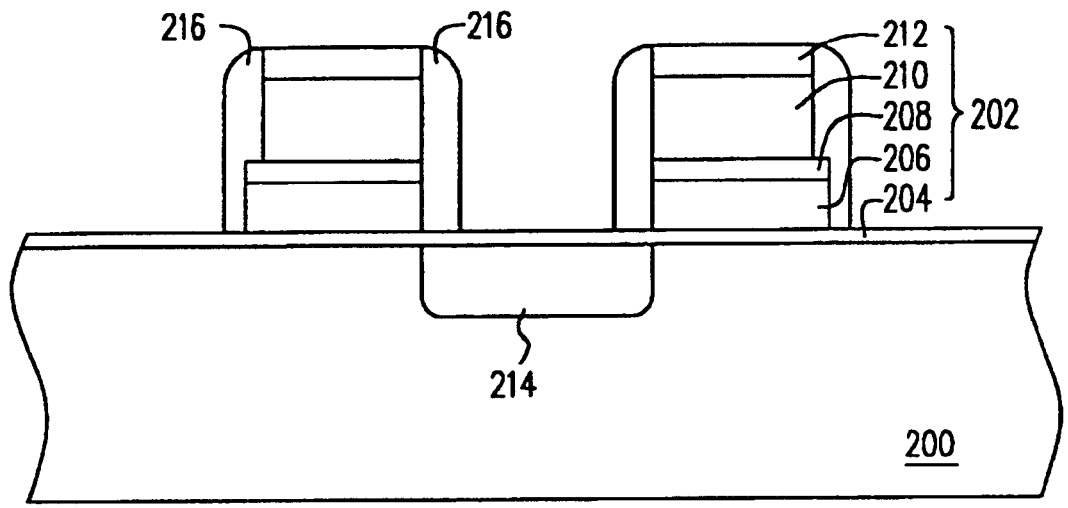
FIGS. 2A to 2F are cross sectional views showing the fabrication process of a flash memory according to one embodiment of the present invention.

Referring to FIG. 2A, a substrate 200 is provided. The substrate 200 comprises a gate structure 202 formed thereon. The gate structure 202 comprises a tunneling oxide layer 204, a floating gate 206, a gate dielectric layer 208, a control gate 210 and a gate cap layer 212, for example. The control gate 210 is located on the substrate 200. The floating gate is formed between the control gate 210 and the substrate 200, while one side of the floating gate 206 is aligned with the floating gate 210. The other side of the floating gate 206 extending over the control gate 210 has a turning corner. The tunneling oxide layer 204 is formed between the floating gate 206 and the substrate 200. The gate dielectric layer 208 is formed between the floating gate 206 and the control gate 210. The gate cap layer 212 is located on the control gate 210. The material for forming the tunneling oxide layer 204 includes silicon oxide, for example. Preferably, the thickness of the tunneling oxide layer 204 is about 90 angstroms to about 100 angstroms. The floating gate 206 is made of doped polysilicon, for example. The material of the gate dielectric layer 208 includes oxide/nitride/oxide with a thickness of about 60/70/60 angstroms, for example. The gate dielectric layer 208 can also be made of silicon oxide and oxide/nitride. The control gate 210 is made of doped polysilicon, for example. The material for forming the gate cap layer 212 includes silicon oxide, for example, and the thickness thereof is about 600 angstroms to about 900 angstroms.

The substrate 200 at one side of the gate structure 202 is implanted with dopant to form a source region 214. A spacer 216 is formed on the sidewall of the gate structure 202. The process for forming the spacer 216 includes forming an insulating layer (not shown) first. The insulating layer includes a silicon oxide layer formed by chemical vapor deposition using tetra-ethyl-ortho-silicate (TEOS)/$O_3$ as reacting gas sources. An anisotropic etching is then performed to remove a part of the insulating layer to form the spacer 216.

Figure 2B:
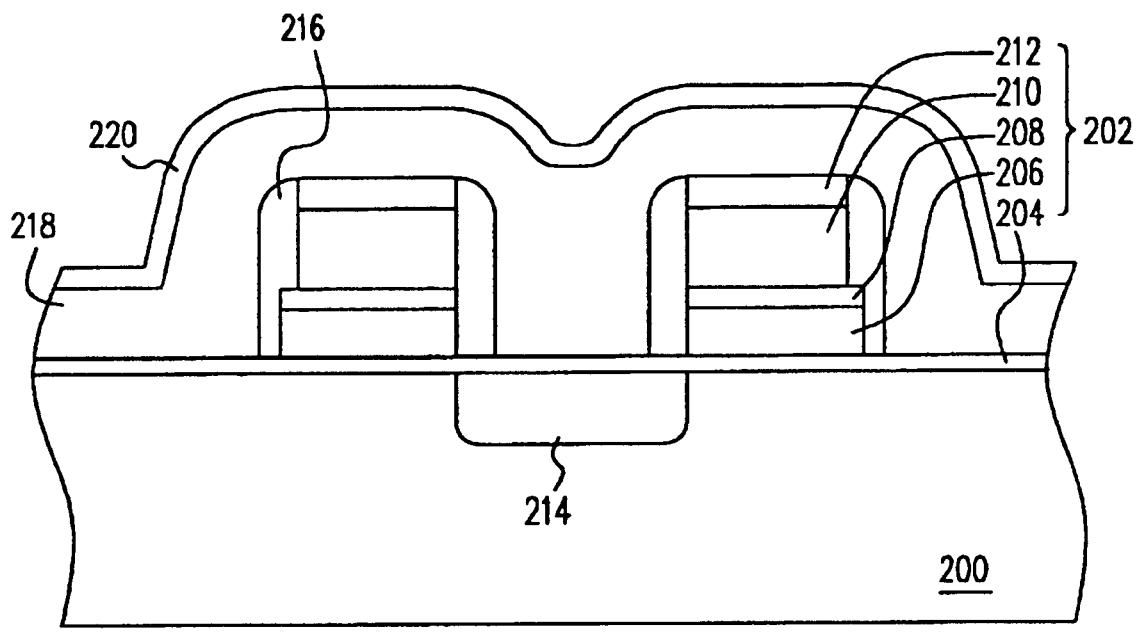

Referring to FIG. 2B, a conductive layer 218 is formed on the substrate 200. The material for forming the conductive layer 218 includes doped polysilicon, for example. The process for forming the conductive layer 218 includes forming an undoped polysilicon layer, followed by ion implantation. A sacrificial layer 220 is then formed on the conductive layer 218. The sacrificial layer 220 includes a silicon nitride layer formed by chemical vapor deposition, for example.

Figure 2C:
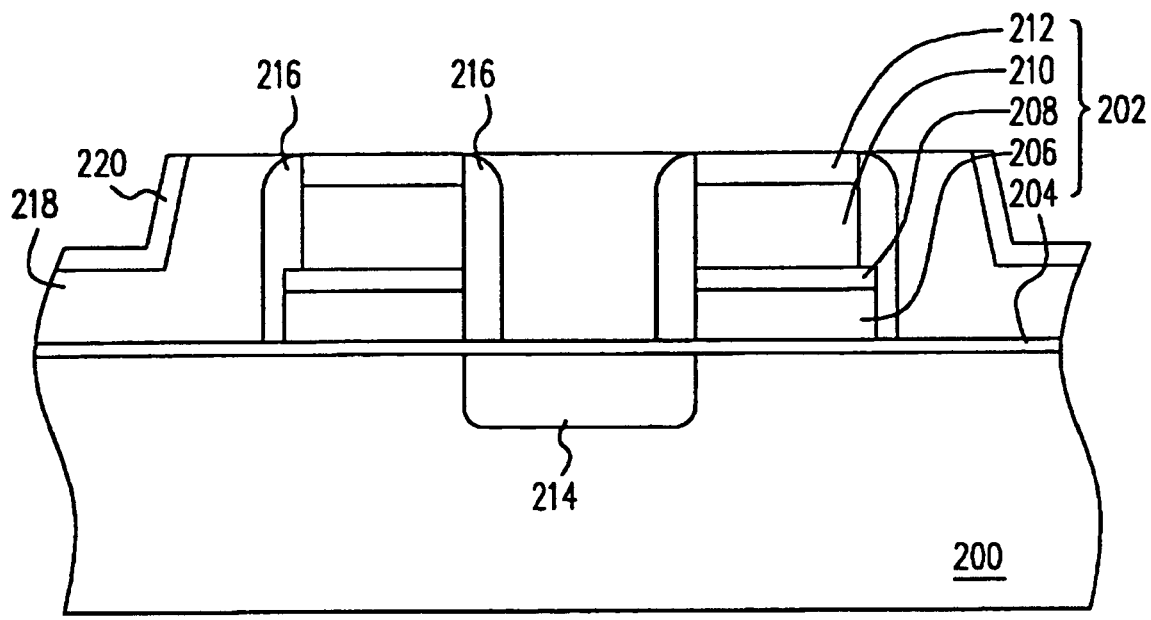

Referring to FIG. 2C, the sacrificial layer 220 and the conductive layer 218 are partially removed until the gate cap layer 216 is exposed. The method for partially removing the sacrificial layer 220 and the conductive layer 218 includes chemical mechanical polishing.

Figure 2D:
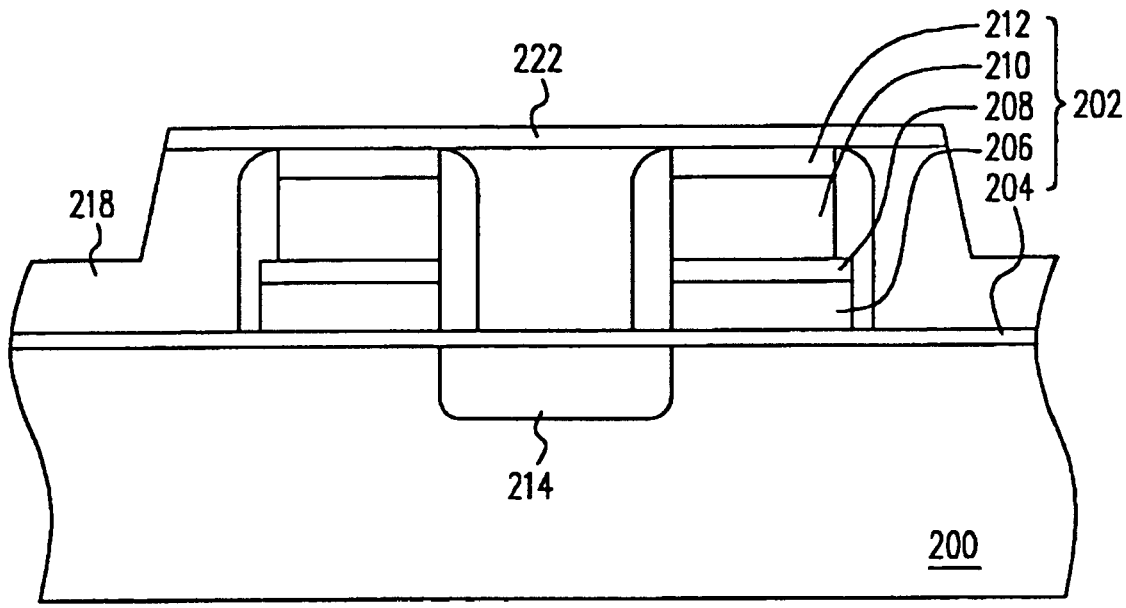

Referring to FIG. 2D, a thermal oxidation process is performed. A mask layer 222 is formed on the conductive layer 218 and the gate cap layer 212. The sacrificial layer 220 remaining on the gate cap layer 212 is then removed. The removal method for the sacrificial layer 220 includes wet etching using hot phosphoric acid as an etchant, for example.

Figure 2E:
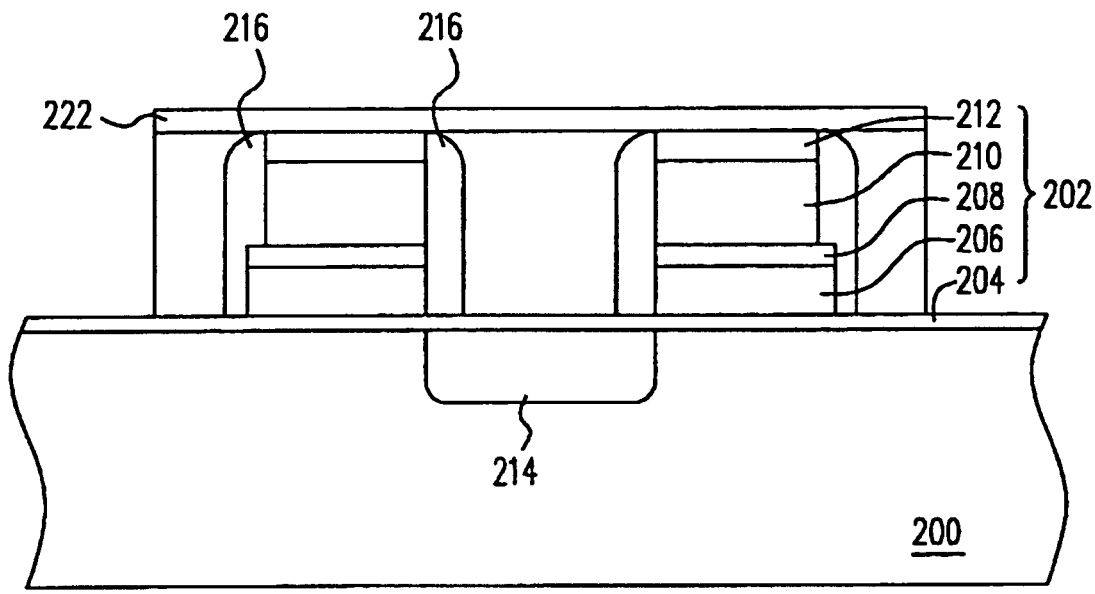
Figure 2F:
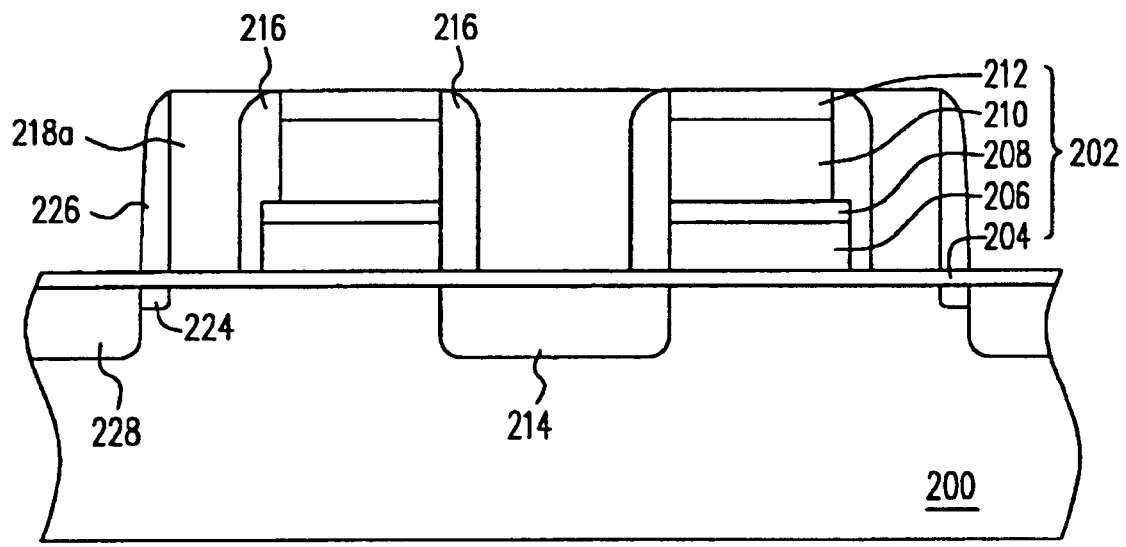

Referring to FIG. 2E, the mask layer 222 is used as a mask for etching the conductive layer 218, so that a square select gate 218a is formed. The mask layer 222 is removed. A lightly doped region 224 is formed in the substrate 200 at the side of the gate structure 202 where the select gate 218 is formed. A spacer 226 is formed on the sidewall of the select gate 218, and a drain region 228 is formed in the substrate 200 at the side of the gate structure 202 (as shown in FIG. 2F). The spacer 226 includes silicon oxide formed by chemical vapor deposition using tetra-ethyl-ortho-silicate and ozone as reacting gas sources, for example. The subsequent process is not essential to the present invention, and is not further described.

According to the above embodiment of the present invention, the conductive layer 218 and the sacrificial layer 220 are formed after forming the gate structure 202, the source region 214, and the spacer 216. Using chemical mechanical polishing, portions of the conductive layer 218 and the sacrificial layer 220 are removed until the gate cap layer 212 is exposed. Using thermal oxidation, the mask layer 222 is formed on the gate cap layer 212 and the conductive layer 218. The remaining sacrificial layer 220 is then removed. The mask layer 222 is used as the mask for performing etching on the conductive layer 218 until the square select gate 218a is formed. The present invention uses the mask layer 222 as the etching mask directly, such that photolithography process is not performed. Therefore, the process is simplified, and the fabrication cost is reduced. Further, the select gate 218a is formed with a square shape, so that the spacer 226 formed subsequently has a promising isolation effect. The electrical contact between the contact window and the cobalt silicide formed on the select gate subsequently is avoided. The device performance is improved, and the product yield is enhanced.

Further, in the above embodiment, one side of the floating gate is aligned with the control gate, while the other side of the floating gate extends over the control gate to result in a corner. It is appreciated that the present invention is also applicable for forming the select gate with a square shape in another structure or shape of the gate structure of the flash memory.

In addition, the method provided by the present invention is not limited to the fabrication process of the select gate of the flash memory. For example, a conductive layer and a sacrificial layer are formed on a stacked structure, followed by a chemical mechanical polishing process to remove portions thereof until the stacked structure is exposed. A thermal oxidation process is then performed for forming a mask layer. After removing the sacrificial layer, the conductive layer is etched using the mask layer as a mask to form a square conductive spacer on the sidewall of the stacked gate. Therefore, the present invention can also be applied to form a square spacer on the sidewall of any stacked structure.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A manufacturing method of a flash memory, comprising:

providing a substrate, on which a gate structure is formed;

forming a source region in the substrate at one side of the gate;

forming a first spacer on the sidewall of the gate structure;

forming a first conductive layer on the substrate;

forming a sacrificial layer on the first conductive layer;

removing portions of the sacrificial layer and the first conductive layer by a chemical mechanical polishing (CMP) method until the gate structure is exposed;

performing thermal oxidation to form a mask layer on the first conductive layer and the gate structure;

removing the sacrificial layer remaining on the first conductive layer;

using the mask layer as a mask to etch the first conductive layer until a square second conductive layer is formed;

removing the mask layer;

forming a lightly doped region in the substrate at the side where the second conductive layer is formed;

forming a second spacer on the sidewall of the second conductive layer; and forming a drain region in the substrate at the side of the second conductive layer.

2. The manufacturing method according to claim 1, wherein the gate structure comprises a tunneling oxide layer, a floating gate, a gate dielectric layer, a control gate and a gate cap layer.

3. The manufacturing method according to claim 1, wherein the second conductive layer is formed as a select gate.

4. The manufacturing method according to claim 2, wherein the material of the tunneling oxide layer includes silicon oxide.

5. The manufacturing method according to claim 2, wherein the material of the gate dielectric layer includes silicon oxide/silicon nitride/oxide.

6. The manufacturing method according to claim 1, wherein the material of the sacrificial layer includes silicon nitride.

7. The manufacturing method according to claim 6, wherein the step of removing the sacrificial layer remaining on the first conductive layer includes wet etching.

8. The manufacturing method according to claim 6, wherein the step of removing the sacrificial layer remaining on the first conductive layer includes using phosphoric acid as an etchant.

9. The manufacturing method according to claim 1, wherein the material of the first spacer includes silicon oxide formed by chemical vapor deposition using tetra-ethyl-ortho-silicate and ozone as gas sources.

10. The manufacturing method apparatus according to claim 1, wherein the second spacer includes silicon oxide formed by chemical vapor deposition using tetra-ethyl-ortho-silicate and ozone as gas sources.

11. The manufacturing method according to claim 1, wherein the material of the first and second conductive layers includes doped polysilicon.

12. A method for fabricating a square spacer, comprising:

providing a substrate having a stacked structure thereon;

forming a conductive layer on the substrate;

forming a sacrificial layer on the conductive layer;

removing portions of the sacrificial layer and the conductive layer until the stacked structure is exposed;

forming a mask layer on the conductive layer and the stacked structure;

removing the sacrificial layer remaining on the conductive layer; and using the mask layer as a mask to etch the conductive layer, so as to form a square spacer.

13. The method according to claim 12, wherein the step of removing portions of the sacrificial layer and the conductive layer includes chemical mechanical polishing.

14. The method according to claim 12, wherein the material of the conductive layer includes doped polysilicon.

15. The method according to claim 12, wherein the material of the sacrificial layer includes silicon nitride.

16. The method according to claim 15, wherein the step of removing the sacrificial layer remaining on the conductive layer includes wet etching.

17. The method according to claim 16, wherein the step of removing the conductive layer includes using phosphoric acid as etchant.

18. The method according to claim 12, wherein the material of the mask layer comprises silicon oxide.

19. The method according to claim 18, wherein the step of forming the mask layer includes thermal oxidation.

20. The method according to claim 12, wherein the stacked structure includes a gate structure.

* * * * *